US010811551B2

(12) United States Patent
Lee et al.

(10) Patent No.: US 10,811,551 B2
(45) Date of Patent: Oct. 20, 2020

(54) TANDEM SOLAR CELL INCLUDING METAL DISK ARRAY

(71) Applicant: Korea Research Institute of Standards and Science, Daejeon (KR)

(72) Inventors: Sang-Jun Lee, Daejeon (KR); Jun-Oh Kim, Yongin-si (KR); Yeongho Kim, Wonju-si (KR); Sang-Woo Kang, Daejeon (KR)

(73) Assignee: Korea Research Institute of Standards and Science, Daejeon (KR)

( * ) Notice: Subject to any disclaimer, the term of this patent is extended or adjusted under 35 U.S.C. 154(b) by 162 days.

(21) Appl. No.: 16/097,590

(22) PCT Filed: Nov. 14, 2017

(86) PCT No.: PCT/KR2017/012824
§ 371 (c)(1),
(2) Date: Oct. 29, 2018

(87) PCT Pub. No.: WO2018/097531
PCT Pub. Date: May 31, 2018

(65) Prior Publication Data
US 2019/0157493 A1  May 23, 2019

(30) Foreign Application Priority Data
Nov. 22, 2016 (KR) .................. 10-2016-0155683

(51) Int. Cl.
*H01L 31/046* (2014.01)
*H01L 31/0224* (2006.01)
(Continued)

(52) U.S. Cl.
CPC ........ *H01L 31/046* (2014.12); *H01L 31/0224* (2013.01); *H01L 31/022425* (2013.01);
(Continued)

(58) Field of Classification Search
CPC .......... H01L 31/046; H01L 31/022425; H01L 31/054; H01L 31/0504; H01L 31/1892;
(Continued)

(56) References Cited

U.S. PATENT DOCUMENTS 7,994,419 B2   8/2011  Pan et al.
2009/0038678 A1  2/2009  Pan et al.
(Continued)

FOREIGN PATENT DOCUMENTS

JP    2014199915 A    10/2014
KR    20100047246 A    5/2010
(Continued)

OTHER PUBLICATIONS

Eun Kyu Kim et al.; "Thin Film Type Solar Cell, Method for Manufacturing the Same and Method for Manufacturing Optical Absorber Layer for Thin Film Type Solar Cell"; Bibliographic data of KR20140061576 (A); May 22, 2014; https://worldwide.espacenet.com.
(Continued)

*Primary Examiner* — Mohammed Shamsuzzaman
*Assistant Examiner* — Aaron J Gray
(74) *Attorney, Agent, or Firm* — Andrew D. Fortney; Central California IP Group, P.C.

(57) ABSTRACT

A tandem solar cell includes a substrate a plurality of sub-cells stacked on the substrate and configured to sequentially perform photoelectric conversion with different wavelength band, and a metal disk array disposed on at least one of interfaces between adjacent sub-cells. A center wavelength of wavelength bands corresponding to the sub-cells gradually decreases as progressing downward with respect to an uppermost layer. The metal disk array reflects a light transmitting a sub-cell disposed over the metal disk array
(Continued)

without being absorbed therein. The metal disk array is inserted by means of wafer bonding.

8 Claims, 12 Drawing Sheets

(51) Int. Cl.
*H01L 31/0687* (2012.01)
*H01L 31/0392* (2006.01)
*H01L 31/18* (2006.01)
*H01L 31/05* (2014.01)
*H01L 31/054* (2014.01)

(52) U.S. Cl.
CPC .... *H01L 31/0392* (2013.01); *H01L 31/03926* (2013.01); *H01L 31/054* (2014.12); *H01L 31/0504* (2013.01); *H01L 31/06875* (2013.01); *H01L 31/18* (2013.01); *H01L 31/1892* (2013.01); *Y02E 10/52* (2013.01); *Y02E 10/544* (2013.01)

(58) Field of Classification Search
CPC ........... H01L 31/0392; H01L 31/03926; H01L 31/18; H01L 31/0224; H01L 31/06875; H01L 31/02366; Y02E 10/544
USPC ...... 136/255, 244, 256; 438/74, 67; 257/448
See application file for complete search history.

(56) References Cited

U.S. PATENT DOCUMENTS

| | | |
|---|---|---|
| 2009/0044860 A1 | 2/2009 | Pan et al. |
| 2011/0318866 A1 | 12/2011 | Pan et al. |
| 2014/0345681 A1 | 11/2014 | Yoshida et al. |
| 2015/0333214 A1* | 11/2015 | Sato ................... H01L 31/1804 438/74 |
| 2016/0005911 A1* | 1/2016 | Sato ................... H01L 31/1892 136/255 |
| 2017/0069782 A1* | 3/2017 | Song .................. H01L 31/1844 |
| 2020/0185553 A1* | 6/2020 | Lee .................... H01L 31/0725 |
| 2020/0227448 A1* | 7/2020 | Tseng ............... H01L 27/14692 |

FOREIGN PATENT DOCUMENTS

| | | |
|---|---|---|
| KR | 101193810 B1 | 10/2012 |
| KR | 20140061576 A | 5/2014 |
| WO | 2013042525 A1 | 3/2013 |

OTHER PUBLICATIONS

Dong Hwan Jun et al.; "Multifunction Solar Cell and a Method for Manufacturing the Same"; Bibliographic data of KR101193810 (B1); Oct. 23, 2012; https://worldwide.espacenet.com.

* cited by examiner

TANDEM SOLAR CELL INCLUDING METAL DISK ARRAY

CROSS-REFERENCE TO RELATED APPLICATIONS

This application is a continuation of and claims priority to PCT/KR2017/012824 filed on Nov. 14, 2017, which claims priority to Korea Patent Application No. 10-2016-0155683 filed on Nov. 22, 2016, the entireties of which are both hereby incorporated by reference.

TECHNICAL FIELD

The present disclosure relates to multi-junction compound solar cells and, more particularly, to a multi-junction compound solar cell having a surface plasmon resonance structure.

BACKGROUND

To satisfy a rapidly growing demand for energy in civilian and industrial fields, the world has been heavily dependent on fossil fuel energy sources such as coal, oil, and natural gas. The consumption of such fossil fuels causes acid rain, $CO_2$, and the like, which results in air pollution, global warming, and serious resource depletion. As an alternative, there is an increasing need for development of next-generation energy sources such as environmentally friendly and renewable solar light, wind power, biomass, geothermal, and the like. Among the next-generation energy sources, the solar energy has advantages such as utilization of the infinite energy of the sun and higher energy conversion efficiency than other renewable energy sources. Therefore, many searches have been conducted on the solar energy. The optical absorption band of the solar spectrum should be broadened to improve the photoelectric conversion efficiency of the solar cell. To this end, multi-junction compound solar cells have been actively studied. The multi-junction compound solar cells are designed to widen the absorption wavelength by multi-stacking III-V compound semiconductors having a high absorption coefficient and various energy bandgaps.

A first-generation solar cell has a single-junction structure using a material capable of converting light energy into battery energy. A second-generation solar cells has a structure in which a light absorption rate is increased by broadening a light absorption band to maximize light absorption. The theoretical maximum efficiency of a first generation solar cell does not exceed 30 percent (%). This is because when a light having energy much larger than band gap energy of a semiconductor thin film constituting a p-n junction is absorbed, excited charges are extinguished as heat and a light having energy lower than the band gap energy is transmitted to result in very large loss caused by the narrow absorption band. To overcome the conversion efficiency of 30% of a solar cell, a method of broadening a light absorption band to maximize conversion efficiency like the second-generation solar cell is used. In such a method, solar cells having larger absorption band energy in a light-incident direction are sequentially stacked.

A tandem solar cell encounters many technical difficulties as follows. That is, there is a method of vertically arranging solar cells suitable for respective wavelength bands in the order of high absorption energy band and connecting an electrode to each of the solar cells, but a substrate used to deposit each solar cell should be removed or fabricated as thin as possible. In addition, light transmission should be maximized by minimizing a size of a bottom electrode or using a transparent substrate.

Due to the development of thin film deposition apparatuses such as MOCVD and MBE, in the field of III-V compound semiconductor solar cell, tunnel junction technology enables a single-junction solar cell and a semiconductor thin film to be connected in series without a metal electrode.

A tandem solar cell suffers from difficulty in stacking three or more layers because a tunnel junction for connecting respective sub-cells in series has a limitation in doping concentration. Moreover, the tandem solar cell has an economical burden because a high-priced thin film deposition process is used.

Frank Dimroth et al. (Prog. Photovolt: Res. Appl., 2014; 22: 277-282) discloses a GaInP/GaInP/GaInAsP/GaInAs 4-junction tunnel junction solar cell having a high photoelectric conversion efficiency of 44.7%.

FIG. 1 illustrates a GaInP/GaInP/GaInAsP/GaInAs 4-junction tunnel junction solar cell.

Referring to FIG. 1, in a quadruple junction solar cell structure, surface roughness of epitaxial layer to be bonded should be very low in order to perform wafer bonding of a GaAs cell/tunnel diode epitaxial layer and a GaInAsP epitaxial layer. The bonding surface roughness is 0.3 nm. A chemical mechanical polishing (CMP) process should be performed to obtain such a surface roughness. The CMP process requires a long process time of several hours and is an expensive process.

There are regions that are not bonded even after wafer bonding is completed. When a solar cell unit device is fabricated in such a region, the device may not operate because no photocurrent flows. As a result, yield of a solar cell unit device which may be manufactured on a high-priced compound semiconductor substrate is reduced.

In a multi-junction solar cell structure, a $p^{++}$-$n^{++}$ tunnel junction (or tunnel diode) is generally used to electrically connect respective sub-cells. High-concentration doping is required to reduce a resistance of a semiconductor used in a tunnel junction. In general, a doping concentration of about $10^{19}$ to $10^{20}$ cm$^{-3}$ is used. However, depending on the characteristics of the semiconductor material or the epitaxial growth conditions, it is difficult to perform doping at a high concentration over a certain level. Even if the doping is performed at a high concentration, dopants may be easily diffused to the periphery. In this case, it is difficult to obtain an abrupt p-n junction interface. Accordingly, the tunnel diode cannot exert its proper functions.

In a tunnel diode disposed below a GaAs sub-cell, dopant diffusion may occur due to heat during a wafer bonding process in which heat is applied. Thus, the tunnel diode may not properly transmit a photocurrent generated in a solar cell to an external circuit. When the dopant diffusion occurs, the doping concentration inside the tunnel diode is lowered to result in increase in a series resistance and local generation of heat. As a result, solar cell efficiency is reduced, which is well known in the art.

A high-efficiency compound solar cell is required to overcome the above-described problems of wafer bonding.

SUMMARY

Example embodiments of the present disclosure provide a tandem solar cell in which a tunnel junction or a tunnel diode connecting serially connected sub-cells of the tandem solar cell is removed and a metal disk is used to obtain optical reflection characteristics and excellent electrical characteristics.

A tandem solar cell according to an example embodiment of the present disclosure includes a substrate a plurality of sub-cells stacked on the substrate and configured to sequentially perform photoelectric conversion with different wavelength band, and a metal disk array disposed on at least one of interfaces between adjacent sub-cells. A center wavelength of wavelength bands corresponding to the sub-cells gradually decreases as progressing downward with respect to an uppermost layer. The metal disk array reflects a light transmitting a sub-cell disposed over the metal disk array without being absorbed therein. The metal disk array is inserted by means of wafer bonding.

In an example embodiment, the plurality of sub-cells may include first to fourth sub-cells sequentially stacked from top to bottom. The metal disk array may be disposed between the second sub-cell and the third sub-cell. The first sub-cell may be an InGaP sub-cell, and a wavelength band of the first sub-cell may be between 400 and 600 nm. The second sub-cell may be GaAs sub-cell, and a wavelength band of the second sub-cell may be between 600 and 800 nm. The third sub-cell may be an InGaAsP sub-cell, and a wavelength band of the third sub-cell may be between 800 and 1,000 nm. The fourth sub-cell 170 may be an InGaAs sub-cell, and a wavelength band of the fourth sub-cell may be between 1,000 nm and 1,300.

In an example embodiment, the metal disk array may have a pitch of 100 to 300 nm.

In an example embodiment, the first sub-cell may include an n-InGaP base layer, a $p^+$-InGaP emitter layer disposed on the n-InGaP base layer, a $p^+$-AlInP window layer disposed on the $p^+$-InGaP emitter layer, and a $p^+$-GaAs contact layer disposed on the $p^+$-AlInP window layer.

In an example embodiment, the second sub-cell may include an $n^{++}$-GaAs contact layer, an n-AlGaAs back surface field layer disposed on the $n^{++}$-GaAs contact layer, an n-GaAs base layer disposed on the n-AlGaAs back surface field layer, a $p^+$-GaAs emitter layer disposed on the n-GaAs base layer, a $p^+$-AlGaAs window layer disposed on the $p^+$-GaAs emitter layer, and a $p^+$-GaAs contact layer disposed on the $p^+$-AlGaAs window layer.

In an example embodiment, the third sub-cell may include an n-InP back surface field layer, an n-InGaAsP base layer disposed on the n-InP back surface field layer, a $p^+$-InGaAsP emitter layer disposed on the n-InGaAsP base layer, a $p^+$-InP window layer disposed on the p+-InGaAsP emitter layer, and a $p^{++}$-InGaAs contact layer disposed on the $p^+$-InP window layer.

In an example embodiment, the fourth sub-cell may include an $n^+$-InP contact layer, an n-InP back surface field layer disposed on the $n^+$-InP contact layer, an n-InGaAs base layer disposed on the n-InP back surface field layer, a $p^+$-InGaAs emitter layer disposed on the n-InGaAs base layer, a $p^+$-InP window layer disposed on the $p^+$-InGaAs emitter layer, and a $p^+$-InP contact layer disposed on the $p^+$-InP window layer.

In an example embodiment, the tandem solar cell may further include a GaAs tunnel junction layer disposed between the first sub-cell and the second sub-cell and an InGaAs tunnel junction layer disposed between the third sub-cell and the fourth sub-cell. The GaAs tunnel junction layer may include a $p^{++}$-GaAs tunnel junction layer and an $n^{++}$-GaAs tunnel junction layer disposed on the $p^{++}$-GaAs tunnel junction layer. The InGaAs tunnel junction layer may include a $p^{++}$-InGaAs tunnel junction layer and an $n^{++}$-InGaAs tunnel junction layer disposed on the $p^{++}$-InGaAs tunnel junction layer.

In an example embodiment, the substrate includes a flexible film substrate, a metal seed layer disposed on the flexible film substrate, and a metal electrode layer disposed on the metal seed layer. An auxiliary metal electrode layer may be disposed between the fourth sub-cell and the metal electrode layer and may be aligned with the fourth sub-cell. The metal seed layer may include chromium (Cr). The metal electrode layer and the auxiliary metal electrode layer may include gold (Au).

In an example embodiment, the metal disk array may include metal disk array seed layer arranged in a matrix form at regular intervals, intermediate metal disk array layer arranged on and aligned with the metal disk array seed layers, and metal disk array ohmic contact layers arranged on the intermediate metal disk array layer. The metal disk array seed layer may includes chromium (Cr) of 20 nm or less. The intermediate metal disk array layer may include gold (Au) or silver (Au). The metal disk array ohmic contact layer may include palladium (Pd).

A method of fabricating a tandem solar cell according to an example embodiment of the present disclosure includes: sequentially laminating a first AlAs sacrificial layer, a first sub-cell, a GaAs tunnel junction layer, and a second sub-cell on a GaAs substrate; sequentially laminating a second AlAs sacrificial layer, a third sub-cell, an InGaAs tunnel junction layer, and a fourth sub-cell on the InP substrate; forming an auxiliary metal electrode layer on the fourth sub-cell of the InP substrate; patterning the InP substrate on which the auxiliary metal electrode layer is formed; sequentially laminating a metal seed layer and a metal electrode layer on a flexible film substrate; bonding the metal electrode layer of the flexible film substrate to the auxiliary metal electrode layer of the patterned InP substrate; removing the second AlAs sacrificial layer disposed between the InP substrate and the third sub-cell to remove the InP substrate from the bonded InP substrate and flexible film substrate; forming a metal disk array on the third sub-cell in the flexible film substrate; locating the metal disk array and the second sub-cell to face each other and compressing the metal disk array and the second sub-cell to be bonded to each other, removing the first AlAs sacrificial layer disposed between the GaAs substrate and the first sub-cell to remove the GaAs substrate; and forming a metal finger electrode pattern on the exposed first sub-cell.

In an example embodiment, the metal disk array on the third sub-cell in the flexible film substrate may include metal disk array seed layers arranged in a matrix format on the third sub-cell in the flexible film substrate, an intermediate metal disk array layer disposed on the lower metal disk array seed layer, and a metal disk array ohmic contact layer disposed on and aligned with the intermediate metal disk array layer. The metal disk array seed layer may include chromium (Cr) or titanium (Ti)/platinum (Pt) of 20 nanometers (nm) or less. The intermediate metal disk array layer may include gold (Au) or silver (Ag). The metal disk array ohmic contact layer may include palladium (Pd).

In an example embodiment, the first sub-cell may be an InGaP sub-cell and a wavelength band of the first sub-cell may be between 400 and 600 nm. The second sub-cell may be a GaAs sub-cell and a wavelength band of the second sub-cell is between 600 and 800 nm. The third sub-cell may an InGaAsP sub-cell and a wavelength band of the third sub-cell may be between 800 and 1,000 nm. The fourth sub-cell may be an InGaAs sub-cell and a wavelength band of the fourth sub-cell may be between 1000 and 1300 nm.

In an example embodiment, the metal disk array may have a pitch of 100 to 300 nm.

In an example embodiment, the first sub-cell may include a $p^+$-GaAs contact layer disposed on a first AlAs sacrificial layer, a $p^+$-AlInP window layer disposed on the $p^+$-GaAs contact layer, a $p^+$-InGaP emitter layer disposed on the $p^+$-AlInP window layer, and an n-InGaP base layer disposed on the $p^+$-InGaP emitter layer.

In an example embodiment, the second sub-cell may include a $p^+$-GaAs contact layer disposed on the GaAs tunnel junction layer, a $p^+$-AlGaAs window layer disposed on the $p^+$-GaAs contact layer, a $p^+$-GaAs emitter layer disposed on the $p^+$-AlGaAs window layer, an n-GaAs base layer disposed on the $p^+$-GaAs emitter layer, an n-AlGaAs back-surface field layer disposed on the n-GaAs base layer, and an $n^{++}$-GaAs contact layer disposed on the n-AlGaAs back surface field layer.

In an example embodiment, the third sub-cell may include a $p^{++}$-InGaAs contact layer disposed on the second AlAs sacrificial layer, a $p^+$-InP window layer disposed on the $p^{++}$-InGaAs contact layer, a $p^+$-InGaAsP emitter layer disposed on the $p^+$-InP window layer, an n-InGaAsP base layer disposed on the $p^+$-InGaAsP emitter layer, and an n-InP back surface field layer disposed on the n-InGaAsP base layer.

In an example embodiment, the fourth sub-cell may include a $p^+$-InP contact layer disposed on the InGaAs tunnel junction layer, a $p^+$-InP window layer disposed on the $p^+$-InP contact layer, a $p^+$-InGaAs emitter layer disposed on the $p^+$-InP window layer, an n-InGaAs base layer disposed on the $p^+$-InGaAs emitter layer, an n-InP back surface field layer disposed on the n-InGaAs base layer, and an $n^+$-InP contact layer disposed on the n-InP back surface field layer.

BRIEF DESCRIPTION OF THE DRAWINGS

The present disclosure will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the present disclosure.

DETAILED DESCRIPTION

Figure 1:
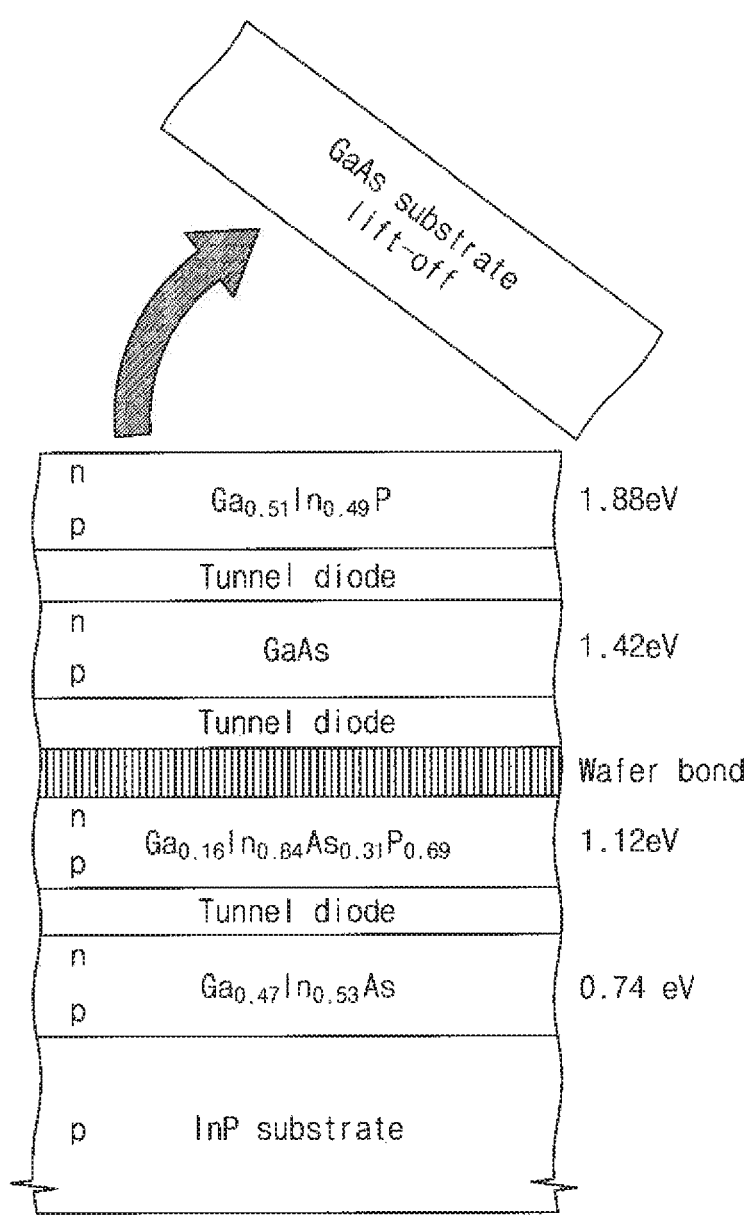
FIG. 1 illustrates a GaInP/GaInP/GaInAsP/GaInAs 4-junction tunnel junction solar cell of Fran Dimroth at al.

A tandem solar cell according to an example embodiment of the present disclosure has a quadruple-junction solar cell structure, and a CMP process is not used in bonding between an epitaxial layer of second sub-cell and a metal disk array (MDA)/a third sub-cell due to a long process time and high cost. Actual bonding is bonding of Pd (palladium) of MDA of a Cr/Au/Pd stacked structure and a heavily doped $n^{++}$-GaAs (contact) epitaxial layer using a wafer bonder. When a pressure is applied to Pd and $n^{++}$-GaAs during the bonding. Pd atoms are diffused into the GaAs layer to form a Pd4GaAs interface. Due to formation of the Pd4GaAs interface, ohmic bonding may be performed and a bonding strength may also be improved.

A pitch and a diameter of the metal disk array may be set to reflect an absorption wavelength band of a first sub-cell and a second sub-cell. Accordingly, the metal disk array may achieve high photoelectric conversion efficiency using ohmic contact characteristics and reflection characteristics.

Since an ohmic junction using an MDA proposed by the present disclosure uses a metal, the problem of dopant diffusion does not occur and a lower resistance value than a serial resistance of a heavily doped semiconductor tunnel diode may be obtained to reduce loss of photocurrent.

According to an example embodiment of the present disclosure, the proposed solar cell may be manufactured on a flexible film. Accordingly, the solar cell may be easily attached to drones, unmanned aerial vehicles, portable devices, and the like. Moreover, there is an advantage that a high-priced GaAs and InP substrate separated from an epitaxial layer of the solar cell can be reused.

A tandem solar cell according to an embodiment of the present disclosure may further improve the solar cell conversion efficiency, which is achieved by performing an electrical serial connection by replacing at least one of the tunnel junctions between respective sub-cells with a metal disk array using surface plasmon resonance (SPR) and providing a selective reflection filter function. The tandem solar cell according to an example embodiment of the present disclosure includes first to fourth sub-cells sequentially stacked from top to bottom. The first to fourth sub-cells may sequentially increase in absorption wavelength bands without overlapping each other. Each of the sub-cells performs photoelectric conversion in different wavelength bands. Accordingly, the sub-cells perform photoelectric conversion in a specific wavelength band during spectral distribution of the sunlight distributed from the visible light region to the infrared region. More specifically, a first sub-cell disposed at the top absorbs light in a wavelength band of 400 nm to 600 nm to perform photoelectric conversion. A second sub-cell disposed below the first sub-cell absorbs light in a wavelength band of 600 nm to 800 nm from the light passing through the first sub-cell and photoelectrically converts the light. A third sub-cell disposed below the second sub-cell absorbs light in a wavelength band of 800 nm to 1000 nm in the light passing through the second sub-cell and photoelectrically converts the light. A fourth sub-cell disposed below the third sub-cell absorbs light in a wavelength band of 1,000 nm to 1,300 nm in the light passing through the third sub-cell and photoelectrically converts the light.

In the above-configured tandem solar cell, the wavelength of 400 nm to 600 nm that is not absorbed in the first sub-cell cannot be absorbed in the other sub-cells disposed therebelow to be lost. To overcome such a disadvantage, there is a requirement for a structure which reflects a light of a short wavelength transmitted without being absorbed and transmits a light of a long wavelength to be absorbed in an underlying sub-cell. To this end, a metal disk array (MDA) is used. The MDA may be disposed between sub-cells to replace a tunnel junction electrically connecting the sub-cells in series. Accordingly, electrical connection of the sub-cells may be achieved, the light of short wavelength passing through the sub-cell may be reflected without being absorbed, and an overlying sub-cell may absorb the reflected light to increase the photoelectric conversion efficiency.

According to an exemplary embodiment of the present disclosure, solar cell conversion efficiency may be improved by increasing a photocurrent of a flexible quadruple junction InGaP/GaAs/InGaAsP/InGaAs solar cell using surface plasmon resonance (SPR) based on a metal disk array (MDA).

Example embodiments of the present disclosure will now be described below more fully with reference to accompanying drawings. The present disclosure may, however, be embodied in different forms and should not be constructed as limited to the embodiments set forth herein. Rather, these embodiments are provided so that this disclosure will be thorough and complete, and will fully convey the scope of the present invention to those skilled in the art.

Reference numerals are indicated in detail in example embodiments of the present disclosure, and their examples are represented in reference drawings. In every possible case, like reference numerals are used for referring to the same or similar elements in the description and drawings.

Figure 2A:
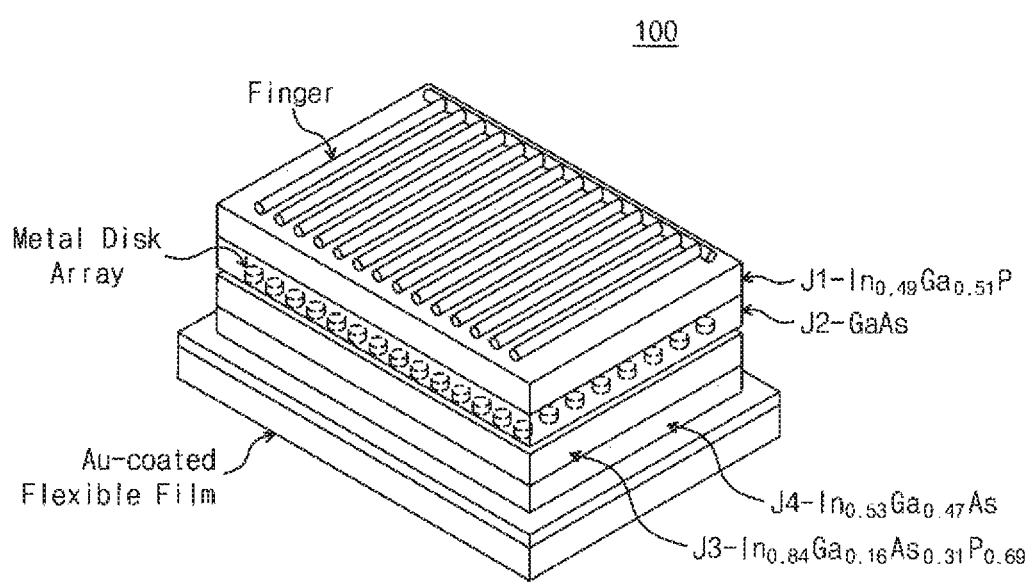
FIG. 2A is a perspective view of a tandem solar cell according to an example embodiment of the present disclosure.

FIG. 2A is a perspective view of a tandem solar cell according to an example embodiment of the present disclosure.

Figure 2B:
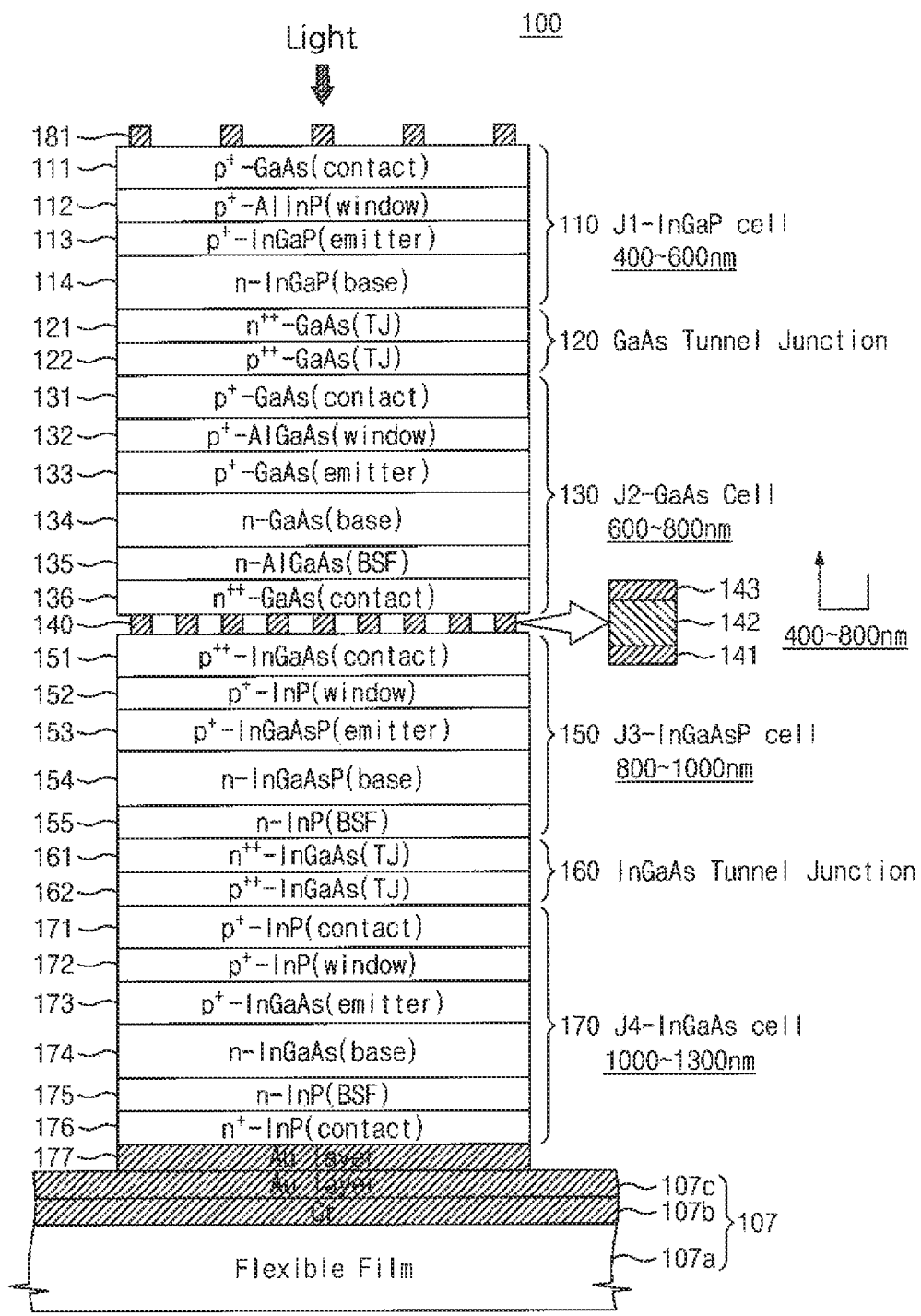
FIG. 2B is a cross-sectional view of the tandem solar cell in FIG. 2A.

FIG. 2B is a cross-sectional view of the tandem solar cell in FIG. 2A.

Referring to FIGS. 2A and 2B, a tandem solar cell 100 includes a substrate 107, a plurality of sub-cells 110, 130, 150, and 170 stacked on the substrate 107 and configured to sequentially perform photoelectric conversion with different wavelength band, and a metal disk array 140 disposed on at least one of interfaces between adjacent sub-cells. A center wavelength of wavelength bands corresponding to the sub-cells gradually decreases as progressing downward with respect to an uppermost layer. The metal disk array 140 reflects a light transmitting a sub-cell disposed over the metal disk array without being absorbed therein. The metal disk array 140 is inserted by means of wafer bonding.

The tandem solar cell 1000 may include four sub-cells 110, 130, 150, and 170 each having a p-n junction. The sub-cells 110, 130, 150, and 170 are connected in series. The first sub-cell 110 has a first p-n junction J1 of $In_{0.49}Ga_{0.51}P$. The second sub-cell 130 has a second p-n junction J2 of GaAs. The third sub-cell 150 has a third p-n junction J3 of $In_{0.84}Ga_{0.16}As_{0.31}P_{0.69}$. The fourth sub-cell 70 has a fourth p-n junction J4 of $In_{0.53}Ga_{0.47}As$.

Accordingly, final conversion efficiency is in proportion to the product of short-circuit current density $J_{SC}$ and an open-circuit voltage $V_{OC}$. At this point, the short-circuit current density $J_{SC}$ establishes a current matching condition due to series connection of the sub-cells. The short-circuit current density $J_{SC}$ is limited to a smallest short circuit current density value of a sub-cell ($J_{SC}=J_{SC}$, min). The open-circuit voltage $V_{OC}$ has a sum of open-circuit voltages of the respective sub-cells ($V_{oc}=V_{oc,J1}+V_{oc,J2}+V_{oc,J3}+V_{oc,J4}$).

Conversion efficiency of a solar cell is in proportion to the product of a photocurrent and an open-circuit voltage. In the structure of a quadruple junction solar cell, a band gap of a semiconductor material becomes smaller from an upper cell to a lower cell. In general, the smaller a bandgap of a semiconductor material, the greater a photocurrent becomes. Thus, the photocurrent generated by a sub-cell increases in the order of InGaP→GaAs→InGaAsP→InGaAs. Since the respective sub-cells are connected in series, the final photocurrent is limited to the minimum current value. For example, when the InGaP cell generates a photocurrent of 10 mA, the GaAs cell generates a photocurrent of 20 mA, the InGaAsP cell generates a photocurrent of 50 mA, and the InGaAs cell generates a photocurrent of 60 mA, the photocurrent of the quadruple junction solar cell is 10 mA because they are connected in series. In general, the smaller a bandgap of the semiconductor material, the smaller the open-circuit voltage $V_{OC}$ of the solar cell becomes. Thus, the open-circuit voltage of each sub-cell decreases in the order of InGaP→GaAs→InGaAsP→InGaAs. Since the sub-cells are connected in series, the final open-circuit voltage of the quadruple junction solar cell is the sum of the respective open-circuit voltages. That is, $V_{oc,total}=V_{oc,InGaP}+V_{oc,GaAs}+V_{oc,InGaAsP}+V_{oc,InGaAs}$. Accordingly, the efficiency of the quadruple junction solar cell is expressed as follows:

efficiency ∝ minimum photocurrent × $(V_{oc,InGaP}+V_{oc,GaAs}+V_{oc,InGaAsP}+V_{oc,InGaAs})$ In the proposed quadruple solar cell, a sub-cell configured to generate the minimum photocurrent is the InGaP cell. As the optical absorption of InGaP increases due to MDA plasmon resonance, the photocurrent of the InGaP sub-cell may be increase proportionally to improve a minimum photocurrent level. In addition, the optical absorption of GaAs sub-cells is also increased by MDA to increase carrier lifetime of photogenerated electrons/holes. As the carrier lifetime increases, the open-circuit voltage increases, which is well known in the art.

As a result, the minimum photocurrents $V_{OC}$ and GaAs may be simultaneously increased in the above efficiency formula by inserting an MDA structure. Therefore, it is expected that the efficiency of the quadruple junction solar cell will be improved. As a result, the photocurrent of the first sub-cell (or J1) or the second sub-cell (or J2) should be increased to improve the conversion efficiency.

To this end, the metal disk array 140 is inserted between the second sub-cell 130 and the third sub-cell 150, which are bonded to each other by a wafer bonding technique. The metal disk array 140 may increase the light absorption of the first sub-cell (or J1) or the second sub-cell (or J2) which is present thereon.

In an incident solar light, when a metal disk array 140 having a diameter less than or equal to a wavelength is formed of a dielectric material, surface plasmon resonance (SPR) that is a collective vibration phenomenon of conduction band electrons at an interface between a metal and a dielectric material occurs. The surface plasmon resonance may be controlled through change in the MDA structure to improve the light absorption characteristics or reflection characteristics of the dielectric material.

A plasmon resonance wavelength based on MDA is expressed as follows:

$$\lambda_{i,j} = \frac{p}{\sqrt{i^2+j^2}} \sqrt{\frac{\varepsilon_m \varepsilon_d}{\varepsilon_m + \varepsilon_d}} \qquad \text{Equation (1)}$$

where p represents a pitch between metal disks, (i, j) represents a scattering factor, $\varepsilon_m$ represents a dielectric constant of a metal, and $\varepsilon_d$ represents a dielectric constant of a semiconductor.

Accordingly, the plasmon resonance wavelength is in proportion to a pitch of the MDA. The pitch of the MDA may be adjusted to increase absorption of a specific region of the wavelength band that can be absorbed by the InGaP and GaAs sub-cells disposed on the MDA. When solar cell epitaxial crystal quality is poor or a component is damaged due to a process defect in a unit component fabrication process, quantum efficiency for a specific wavelength band of the solar cell is reduced. When the pitch of the MDA is adjusted for the plasmon resonance in a wavelength region in the quantum efficiency is low, the light absorption may be improved to increase the quantum efficiency. Thus, the photoelectric conversion efficiency of the solar cell increase. When the pitch of the MDA having the same diameter in a limited solar cell area is adjusted, an open ratio is changed. When a solar light is incident on a surface of the MDA, the change in open ratio affects a solar reflectance toward the InGaP and GaAs sub-cells and a transmittance toward the InGaAsP and InGaAs sub-cells.

According to previous studies, it has been reported that a photocurrent is improved due to a plasmon phenomenon caused by coating nanoparticles on a surface of a solar cell. However, when the nanoparticles are placed on the surface of the solar cell, a light absorption area of the solar cell is reduced by an area the nanoparticles that occupy. Meanwhile, in example embodiments of the present disclosure, the MDA is disposed below the InGaP and GaAs sub-cells required to increase their light absorptions. Accordingly, there is no such problem as the above-describe decrease in the actual light absorption area. Since the MDA is disposed above the InGaAsP/InGaAs sub-cells, a solar light incident on the sub-cell may decreases but a photocurrent of the final quadruple junction solar cell is determined as a photocurrent of the InGaP sub-cell. As a result, the improved efficiency may be achieved in the quadruple junction solar cell with a combined MDA according to example embodiments of the present disclosure.

An open ratio of the metal disk array 140 may be between 50 and 90 percent. For example, the plurality of sub-cells include first to fourth sub-cells 110, 130, 150, and 170 which are sequentially stacked from top to bottom. The metal disk array 140 may be disposed between the second sub-cell 130 and the third sub-cell 150. The first sub-cell 110 may be an InGaP sub-cell, and a wavelength band of the first sub-cell 110 may be between 400 and 600 nm. The second sub-cell 130 may be a GaAs sub-cell, and a wavelength band of the second sub-cell may be between 600 and 800 nm. The third sub-cell 150 may be an InGaAsP sub-cell, and a wavelength band of the third sub-cell 150 may be between 800 and 1,000 nm. The fourth sub-cell 170 may be an InGaAs sub-cell, and a wavelength band of the fourth sub-cell 170 may be between 1,000 nm and 1,300. The first sub-cell 110 may receive a solar light to absorb a part of light having a wavelength of 400 nm to 600 nm and transmit the remaining light. The second sub-cell 130 may absorb a part of the light having a wavelength of 600 nm-800 nm and transmit the remaining light.

The metal disk array 140 may be designed to mainly reflect a light having a wavelength of 400 nm to 800 nm in the received light. More specifically, a pitch of the metal disk array 140 may be between 100 and 300 nm. A diameter of the disc may be at a level of 50 to 70 percent of the pitch. The metal disk array 140 includes metal disk array seed layer 141 arranged in a matrix form at regular intervals, intermediate metal disk array layer 142 arranged to be aligned with the metal disk array seed layers 141, and metal disk array ohmic contact layers 143 arranged on the intermediate metal disk array layer 142. The metal disk array seed layer 141 includes chromium (Cr) of 20 nm or less, the intermediate metal disk array layer 142 includes gold (Au) or silver (Au), and the metal disk array ohmic contact layer 143 may include palladium (Pd).

In the metal disk array 140 having a structure in which a metal disk array seed layer, an intermediate metal disk array layer, and a metal disk array ohmic contact layer are stacked using a wafer bonder, bonding of palladium (Pd) and the heavily doped $n^{++}$-GaAs contact layer 136 is performed. When the pressure is applied to the Pd and $n^{++}$-GaAs contact layers 126 during the bonding, Pd atoms are diffused into the $n^{++}$-GaAs contact layer 126. Thus, a Pd4GaAs interface may be formed to perform ohmic bonding and increase bonding strength.

Since the ohmic junction using the metal disk array 140 uses a metal, dopant diffusion may not occur. In addition, since the ohmic junction has a resistance lower than a serial resistance of a heavily doped semiconductor tunnel diode, loss of a photocurrent may be reduced. Each of the sub-cells 110, 130, 150, and 170 may be a semiconductor that is a group III-V compound having a p-n junction of an n-type base layer and a p-type emitter layer. The sub-cells may be grown by means of epitaxial growth.

The first sub-cell 110 may include an n-InGaP base layer 114, a $p^+$-InGaP emitter layer 113 disposed on the n-InGaP base layer 114, a $p^+$-AlInP window layer 112 disposed on the $p^+$-InGaP emitter layer 113, and a $p^+$-GaAs contact layer 111 disposed on the $p^+$-AlInP window layer 112. The n-type impurity may be silicon (Si), and the p-type impurity may be beryllium (Be).

The GaAs tunnel junction layer 120 may be disposed between the first sub-cell 110 and the second sub-cell 130. The GaAs tunnel junction layer 120 includes a $p^{++}$-GaAs tunnel junction layer 122 and an $n^{++}$-GaAs tunnel junction layer 121 disposed on the $p^{++}$-GaAs tunnel junction layer 122.

The second sub-cell 130 may include an $n^{++}$-GaAs contact layer 136, an n-AlGaAs back surface field layer 135 disposed on the $n^{++}$-GaAs contact layer 136, an n-GaAs base layer 134 disposed on the n-AlGaAs back surface field layer 135, a $p^+$-GaAs emitter layer 133 disposed on the n-GaAs base layer 134, a $p^+$-AlGaAs window layer 132 disposed on the $p^+$-GaAs emitter layer 133, and a $p^+$-GaAs contact layer 131 disposed on the $p^+$-AlGaAs window layer 132.

The metal disk array 140 includes metal disk array seed layers 141 arranged in a matrix form, intermediate metal disk array layer 142 disposed on and aligned with the metal disk array seed layers 141, and metal disk array ohmic contact layers 143 disposed on and aligned with the intermediate metal disk array layer 142. The metal disk array seed layer 141 may include chromium (Cr) of 20 nm or less, the intermediate metal disk array layer 142 may include gold (Au) or silver (Ag), and the metal disk array ohmic contact layer 143 may include palladium (Pd).

A metal used for MDA fabrication is Cr/Au/Pd, which is deposited on the $p^{++}$-InGaAs contact layer 151 by electron beam evaporation. Alternatively, deposition of Ti/Pt/Au/Pd may be used. Cr/Au (or Ti/Pt/Au) deposited on the $p^{++}$-InGaAs contact layer 151 is thermally treated to form an ohmic junction and strong bonding is established between the MDA and the InGaAs layer.

Palladium (Pd) is used to bond MDA with the $n^{++}$-GaAs contact layer 136 layer disposed above the MDA. In the case of bonding using a wafer bonder, a process is generally performed at a high temperature (higher than or equal to 400 degrees Celsius). Such a high temperature wafer bonding process causes crystal degradation of a III-V compound semiconductor to reduce crystal quality, which is prevented using palladium (Pd). A surface diffusion coefficient of Pd atoms is so high that when Pd atoms come in contact with the GaAs layer even at room temperature, Pd atoms are diffused toward GaAs. A diffusion process is performed forms a Pd 4GaAs interface having a low ohmic contact resistance and to establish strong bonding between the MDA and $n^{++}$-GaAs layers.

Accordingly, wafer bonding between the J2 and J3 sub-cells and plasmon effect resulting from periodically arranged Au may be obtained at the same time by introducing the Cr/Au/PD MDA.

The third sub-cell 150 may include an n-InP back surface field layer 155, an n-InGaAsP base layer 154 disposed on the n-InP back surface field layer 155, a $p^+$-InGaAsP emitter layer 153 disposed on the n-InGaAsP base layer 154, a $p^+$-InP window layer 152 disposed on the $p^+$-InGaAsP emitter layer 153, and a $p^{++}$-InGaAs contact layer 151 disposed on the $p^+$-InP window layer.

The InGaAs tunnel junction layer 160 may be disposed between the third sub-cell 150 and the fourth sub-cell 170. The InGaAs tunnel junction layer 160 includes a $p^{++}$-InGaAs tunnel junction layer 162 and an $n^{++}$-InGaAs tunnel junction layer 161 disposed on the $p^{++}$-InGaAs tunnel junction layer.

The fourth sub-cell 170 may include an $n^+$-InP contact layer 176, an n-InP back surface field layer 175 disposed on the $n^+$-InP contact layer 176, an n-InGaAs base layer 174 disposed on the n-InP back surface field layer 175, a $p^+$-InGaAs emitter layer 173 disposed on the n-InGaAs base layer 174, a $p^+$-InP window layer 172 disposed on the $p^+$-InGaAs emitter layer 173, and a $p^+$-InP contact layer 171 disposed on the $p^+$-InP window layer 172.

The substrate 107 includes a flexible film substrate 107a, a metal seed layer 107b disposed on the flexible film substrate 107a, and a metal electrode layer 107c disposed on the metal seed layer 107b.

An auxiliary metal electrode layer 177 may be disposed between the fourth sub-cell 170 and the metal electrode layer 107c and may be aligned with the fourth sub-cell 170. The metal seed layer 107b may include chromium (Cr), and the metal electrode layer 107c and the auxiliary metal electrode layer 177 may include gold (Au).

A $p^+$ ($n^+$) contact layer may serve to collect holes (electrons) formed in a base layer. A $p^+$-window is a window layer formed of a material having a greater bandgap than an emitter semiconductor material. If there is no window layer on the emitter, an emitter material has a very fast surface recombination speed. Thus, optical carriers may not be released to an external circuit and may be recombined in the emitter to be removed. The window layer serves to lower the fast recombination rate to improve external quantum efficiency.

A base layer includes a depletion region in which optical carriers (electrons and holes) are mainly formed through light absorption. Of the optical carriers, electrons are allowed to drift toward an n-type semiconductor and holes are allowed to drift toward a p-type semiconductor by an internal electric field generated at the p-n junction interface.

A $p^{++}/n^{++}$-tunnel junction layer is heavily doped with impurities at a concentration of $10^{19}$ to $10^{20}$ cm$^{-3}$ to be formed to have a very small thickness of several tens to several nanometers. A tunnel junction should have very low series resistance to allow sub-cells to be electrically interconnected and should be formed to significantly reduce optical absorption of the tunnel junction layer.

An n-BSF layer is disposed on a contact layer having a relatively high doping concentration, and an interfacial electric field is generated at an interface between two semiconductor materials (BSF and contact layer) due to a difference in doping concentration between the two semiconductor materials (BSF and contact layer). The interfacial electric field serves to prevent minority carriers from migrating to the contact layer and recombining with the majority carriers. In example embodiments of the present disclosure, an n-type BSF layer is used and the interfacial electric field prevents holes (minority carriers) from recombining with electrons (majority carriers) in an $n^+$-contact layer. Non-recombined holes migrate to a p-type semiconductor and are released to the external circuit to contribute to the improvement of photocurrent.

Figure 3:
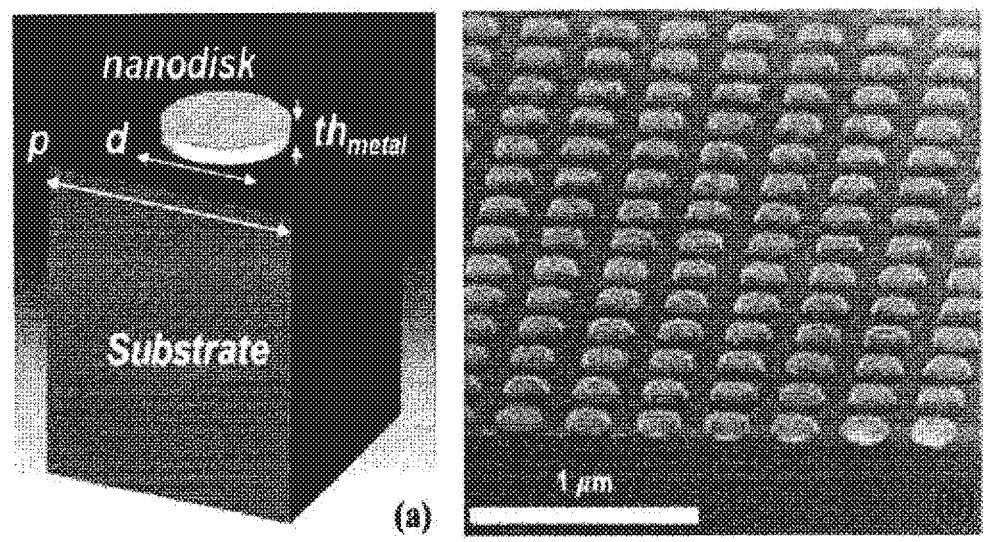
FIG. 3 illustrates a metal disk array (MDA) structure according to an example embodiment of the present disclosure and a shape, a reflection, and a conversion efficiency rise rate of the MDA structure.
Figure 3:
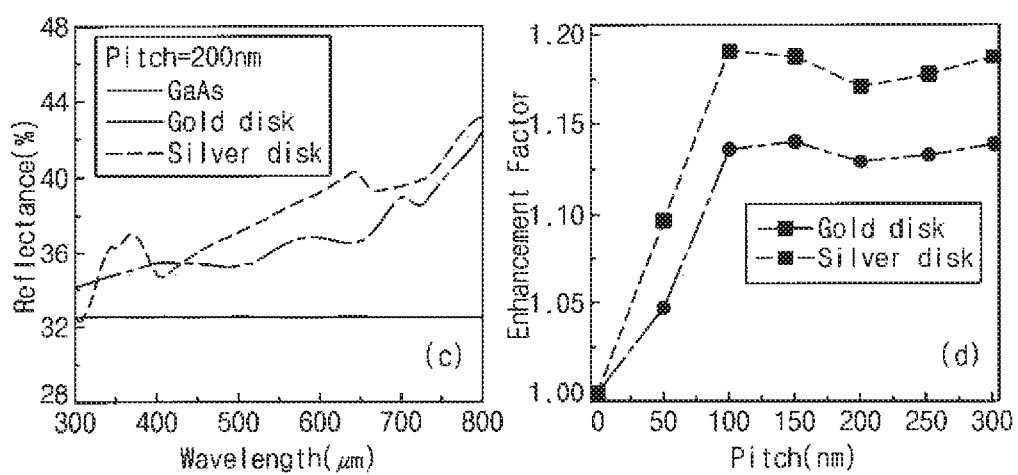

FIG. 3 illustrates a metal disk array (MDA) structure according to an example embodiment of the present disclosure and a shape, a reflection, and a conversion efficiency rise rate of the MDA structure.

Referring to FIG. 3, a simulation was performed using finite difference time domain (FDTD) to investigate the degree of optical absorption enhancement of an upper sub-cell according to an MDA structure shown in an image (a). Through such a theoretical simulation, an MDA structure is designed to significantly increase light absorption. As shown in image (b), the optimal MDA structure is fabricated by means of nanoimprint lithography (NIL). A substrate is a GaAs substrate. An MDA has a diameter of 60% of a pitch and a thickness of 20 nm.

A graph (c) shows reflectance spectra of an MDA-free GaAs substrate and a gold/silver MDA structure. In the absence of MDA, a reflectance of the substrate is constant, which is approximately 32% within the wavelength range from 300 to 800 nm. However, a reflectance of the gold and silver MDA structure tends to increase as a wavelength increases, and thus the entire reflectance increases (>32%). That is, light absorption of an upper sub-cell may increase by a reflectance increased by introducing an MDA structure below the upper sub-cells J1 and J2. When an MDA structural simulation is further optimized, further improved optical absorption may be expected in the range from 400 to 600 nm that is a main absorption wavelength of the first sub-cell 110 and in the range from 600 to 800 nm that is a main absorption wavelength of the second sub-cell 130.

A graph (d) shows the reflectance improvement of the gold/silver MDA structure versus a reflectance of a substrate without the MDA structure according to an MDA pitch in the wavelength range from 300 to 800 nm.

$$\frac{\int R_{MDA}(\lambda)d\lambda}{\int R_{GaAs}(\lambda)d\lambda} \qquad \text{Equation (2)}$$

When the pitch is 150 nm (100 nm) in the gold/silver MDA structure, the reflectance improvement is maximum. The silver MDA structure exhibited higher reflectance improvement than the gold MDA structure at the same pitch due to a difference in dielectric constant.

The gold/silver MDA structure may be used as an excellent electrical interconnector between J2 (GaAs) and J3 (InGaAsP) sub-cells. In a conventional multi-junction solar cell, a very thin tunnel junction layer having a thickness of several to several tens of nanometers is used for electrical connection of each sub-cell. The tunnel junction layer has a structure in which a compound semiconductor is heavily doped with impurities. It is difficult to obtain an abrupt doping profile due to impurity diffusion in a doping process, and it is difficult to implement heavy doping at a higher concentration than a constant level. Therefore, it is difficult to form a tunnel junction having a very low electrical resistance. Meanwhile, since the gold/silver MDA structure has a much higher electrical conductivity ($\sigma_{gold}$=4.1×10$^7$ S/m, $\sigma_{silver}$=6.3×10$^7$ S/m at 20° C.) than the semiconductor tunnel junction layer, the gold/silver MDA structure may be used as an excellent electrical interconnector to significantly reduce electrical loss. Thus, the gold/silver MDA structure proposed in the present disclosure may effectively increase light absorption of an upper sub-cell and transfer a photocurrent generated in the upper sub-cell and a lower sub-cell without loss to improve the photoelectric conversion efficiency of a multi-junction solar cell.

FIGS. 4A to 4H illustrate a method of manufacturing a tandem solar cell according to an exemplary embodiment of the present disclosure.

Referring to FIGS. 4A to 4G, a method of fabricating a tandem solar cell 100 includes sequentially laminating a first AlAs sacrificial layer 119, a first sub-cell 110, a GaAs tunnel junction layer 120, and a second sub-cell 130 on a GaAs substrate 105; sequentially laminating a second AlAs sacrificial layer 159, a third sub-cell 150, an InGaAs tunnel junction layer 160, and a fourth sub-cell 170 on the InP substrate 106; forming an auxiliary metal electrode layer 177 on the fourth sub-cell 170 of the InP substrate 106; patterning the InP substrate 106 on which the auxiliary metal electrode layer 177 is formed; sequentially laminating a metal seed layer 107b and a metal electrode layer 107c on a flexible film substrate 107a; bonding the metal electrode layer 107c of the flexible film substrate 107a to the auxiliary metal electrode layer 177 of the patterned InP substrate 106; removing the second AlAs sacrificial layer 159 disposed between the InP substrate 106 and the third sub-cell 150 to remove the InP substrate 106 from the bonded InP substrate 106 and flexible film substrate 107; forming a metal disk array 140 on the third sub-cell 150 in the flexible film substrate 107; locating the metal disk array 140 and the second sub-cell 130 to face each other and compressing the metal disk array 140 and the second sub-cell 130 to be bonded to each other, removing the first AlAs sacrificial layer 119 disposed between the GaAs substrate 105 and the first sub-cell 110 to remove the GaAs substrate 105; and forming a metal finger electrode pattern 181 on the exposed first sub-cell 110.

The first sub-cell 110 may be an InGaP sub-cell, and a wavelength band of the first sub-cell 110 may be between 400 and 600 nm. The second sub-cell 130 may be a GaAs sub-cell, and a wavelength band of the second sub-cell 130 may be between 600 and 800 nm. The third sub-cell 150 may be an InGaAsP sub-cell, and a wavelength band of the third sub-cell 150 may be between 800 and 1,000 nm. The fourth sub-cell 170 may be an InGaAs sub-cell, and a wavelength band of the fourth sub-cell 170 may be between 1000 and 1300 nm. A pitch of the metal disk array 140 may be between 100 and 300 nm.

Solar cell epitaxial growth is achieved using a thin film epitaxial growth technique such as metalorganic chemical vapor deposition (MOCVD) or molecular beam epitaxy (MBE). An epitaxial structure includes a first AlAs sacrificial layer 119, a first sub-cell 110, a GaAs tunnel junction layer 120, and a second sub-cell 130 which are grown on a GaAs substrate 105 with lattice matching. The epitaxial structure also includes a second AlAs sacrificial layer 159, a third sub-cell 150, an InGaAs tunnel junction layer 160 and a fourth sub-cell 170 structure which are grown on the InP substrate 106 with lattice matching.

Figure 4A:
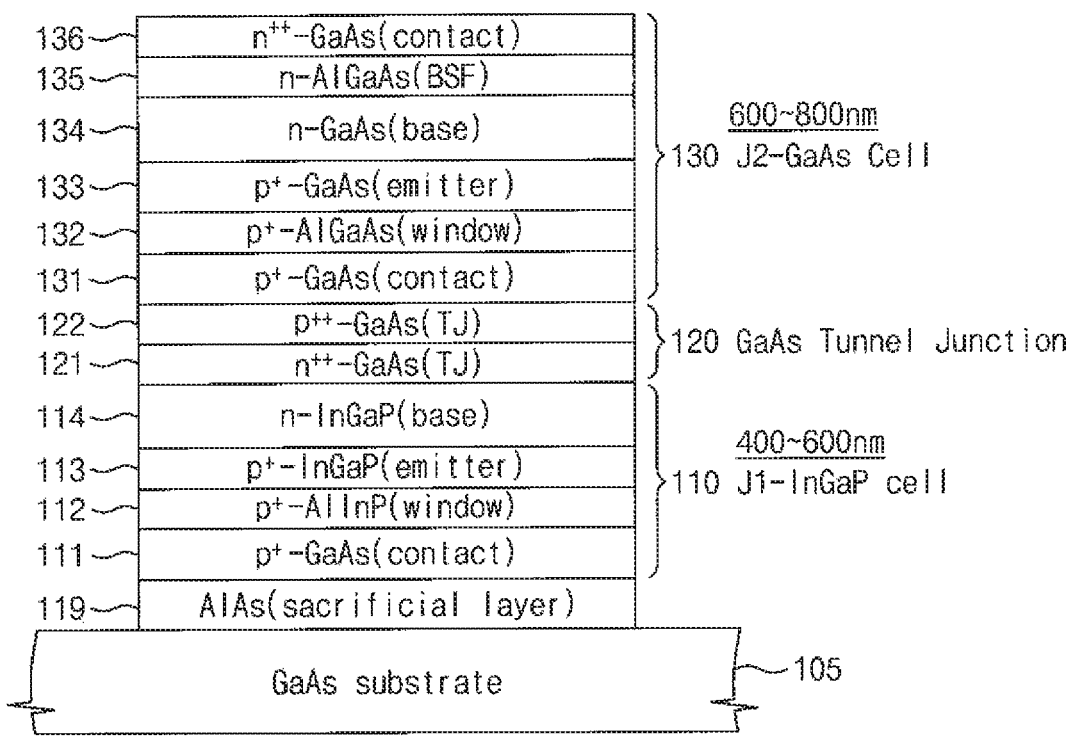
FIGS. 4A to 4H illustrate a method of manufacturing a tandem solar cell according to an exemplary embodiment of the present disclosure.

Referring to FIG. 4A, a first AlAs sacrificial layer 119, a first sub-cell 110, a GaAs tunnel junction layer 120, and a second sub-cell 130 are sequentially laminated on a GaAs substrate 105. The first AlAs sacrificial layer 119 may have a thickness of several tens of nanometers (nm) or less. The first sub-cell 110 includes a p$^+$-GaAs contact layer 111 disposed on the first AlAs sacrificial layer 119, a p$^+$-AlInP window layer 112 disposed on the p$^+$-GaAs contact layer, a p$^+$-InGaP emitter layer 113 disposed on the p$^+$-AlInP window layer, and an n-InGaP base layer 114 disposed on the p$^+$-InGaP emitter layer 113.

The GaAs tunnel junction layer 120 includes an n$^{++}$-GaAs layer 121 disposed on the n-InGaP base layer 114 and a p$^{++}$-GaAs layer 122 disposed on the n$^{++}$-GaAs layer 121.

The second sub-cell 130 may include a p$^+$-GaAs contact layer 131 disposed on the GaAs tunnel junction layer 120, a p$^+$-AlGaAs window layer 132 disposed on the p$^+$-GaAs contact layer 131, a p$^+$-GaAs emitter layer 133 disposed on the p$^+$-AlGaAs window layer 132, an n-GaAs base layer 144 disposed on the p$^+$-GaAs emitter layer 133, an n-AlGaAs back-surface field layer 145 disposed on the n-GaAs base layer 144, and an n$^{++}$-GaAs contact layer 145 disposed on the n-AlGaAs back surface field layer 145.

After the first AlAs sacrificial layer 119, the first sub-cell 110, the GaAs tunnel junction layer 120, and the second sub-cell 130 are sequentially laminated on the GaAs substrate 105, the first AlAs sacrificial layer 119, the first sub-cell 110, the GaAs tunnel junction layer 120, and the second sub-cell 130 may be patterned.

Figure 4B:
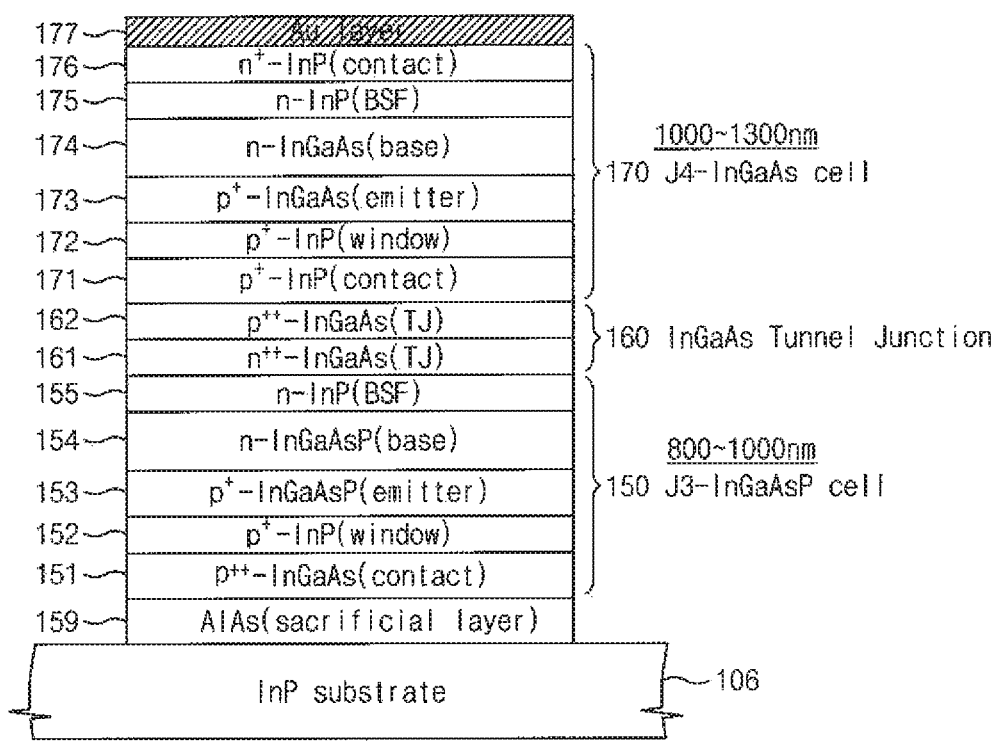

Referring to FIG. 4B, a second AlAs sacrificial layer 159, a third sub-cell 150, an InGaAs tunnel junction layer 160, and a fourth sub-cell 170 may be sequentially laminated on an InP substrate 106.

A second AlAs sacrificial layer 159 is formed on the InP substrate 106. The second AlAs sacrificial layer 159 may have a thickness of 20 nm or less. The third sub-cell 150 may be formed on the second AlAs sacrificial layer 159.

The third sub-cell 150 may include a p$^{++}$-InGaAs contact layer 151 disposed on the second AlAs sacrificial layer 159, a p$^+$-InP window layer 152 disposed on the p$^{++}$-InGaAs contact layer 151, a p$^+$-InGaAsP emitter layer 153 disposed on the p$^+$-InP window layer 152, an n-InGaAsP base layer 154 disposed on the p$^+$-InGaAsP emitter layer 153, and an n-InP back surface field layer 155 disposed on the n-InGaAsP base layer 154.

The InGaAs tunnel junction layer 160 may includes an n$^{++}$-InGaAs tunnel junction layer 161 disposed on the n-InP back surface field layer 155 of the third sub-cell 150, and a p$^{++}$-InGaAs tunnel junction layer 162 disposed on the n$^{++}$-InGaAs tunnel junction layer 161.

The fourth sub-cell 170 includes a p$^+$-InP contact layer 171 disposed on the InGaAs tunnel junction layer 160, a p$^+$-InP window layer 172 disposed on the p$^+$-InP contact layer 171, a p$^+$-InGaAs emitter layer 173 disposed on the p$^+$-InP window layer 172, an n-InGaAs base layer 174 disposed on the p$^+$-InGaAs emitter layer 173, an n-InP back surface field layer 175 disposed on the n-InGaAs base layer 174, and an n$^+$-InP contact layer 176 disposed on the n-InP back surface field layer 175.

An auxiliary metal electrode layer 177 may be formed on the fourth sub-cell 170 of the InP substrate 106. That is, the auxiliary metal electrode layer 177 may be disposed on the n$^+$-InP contact layer 176 of the fourth sub-cell 170. The auxiliary metal electrode layer 177 may be formed of gold.

The InP substrate 106 on which the auxiliary metal electrode layer 177 is formed may be patterned. The patterning process may be a photolithography process and a dry etching process or a wet etching process.

The metal seed layer 107b and the metal electrode layer 107c may be sequentially laminated on the flexible film substrate 107a. The metal seed layer 107b may include chromium, and the metal electrode layer 107c may include gold.

Figure 4C:
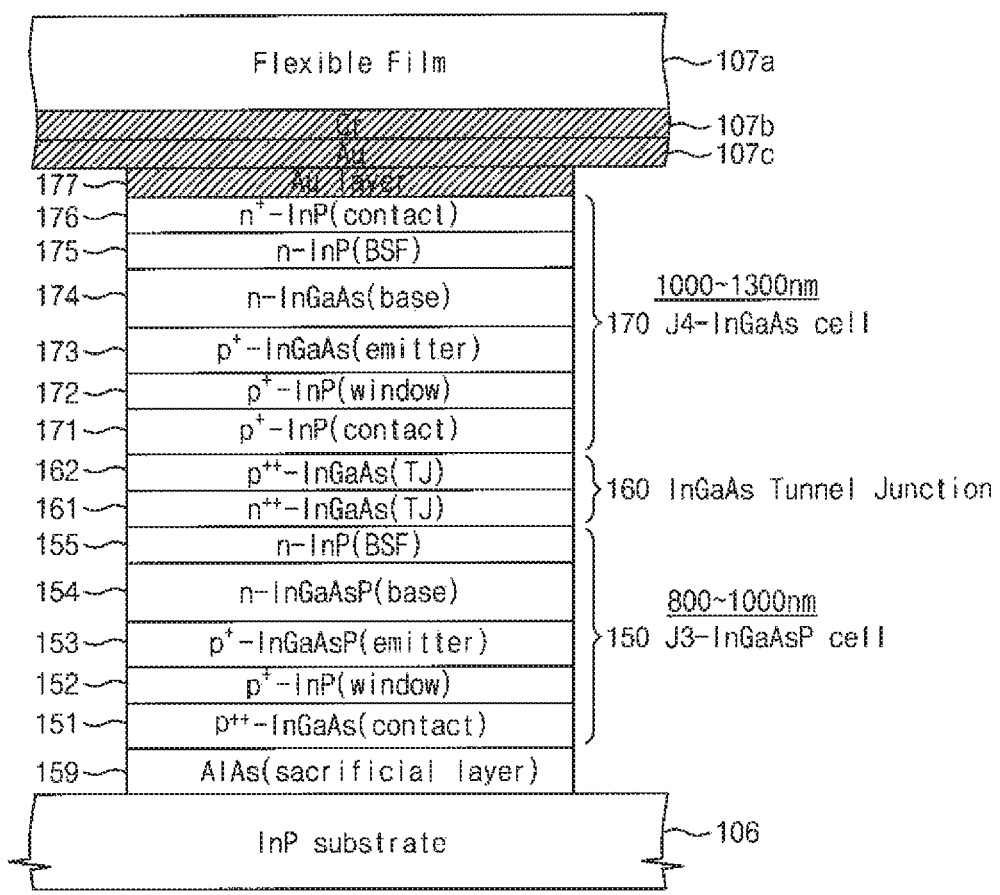

Referring to FIG. 4C, the metal electrode layer 107c of the flexible film substrate 107a and the auxiliary metal electrode layer 177 of the patterned InP substrate may be bonded to each other. The bonding of the metal electrode layer 177 and the auxiliary metal electrode layer 107c may be performed by applying a constant pressure.

Figure 4D:
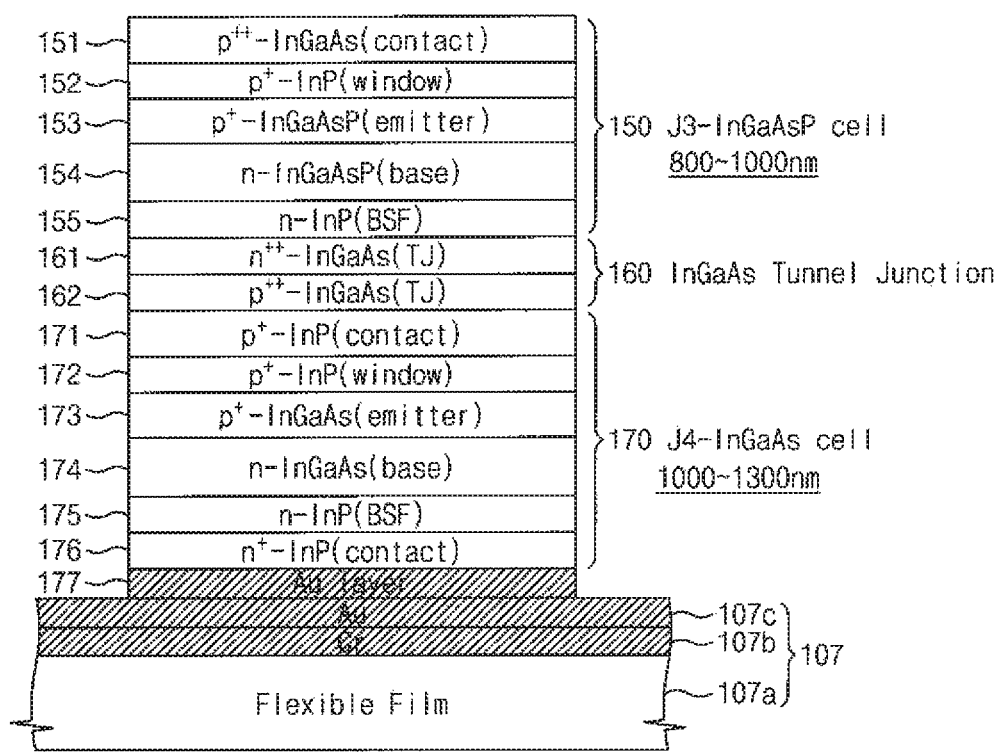

Referring to FIG. 4D, the second AlAs sacrificial layer 159 disposed between the InP substrate 106 and the third sub-cell 150 is removed from the InP substrate and the flexible film substrate, which are bonded to each other, to remove the InP substrate 106. Accordingly, the $p^{++}$-InGaAs contact layer 151 of the third sub-cell 150 may be exposed. During removal of the second AlAs sacrificial layer 159, only the second AlAs sacrificial layer 159 is selectively etched by an hydrogen fluoride (HF) solution by dipping the second AlAs sacrificial layer 159 in a diluted solution in which hydrogen fluoride (HF) and deionized water (DI water) are diluted 1:5. Therefore, an epitaxial lift-off (ELO) process is used to separate the J3/J4 solar cell and the InP substrate 106 from each other.

Figure 4E:
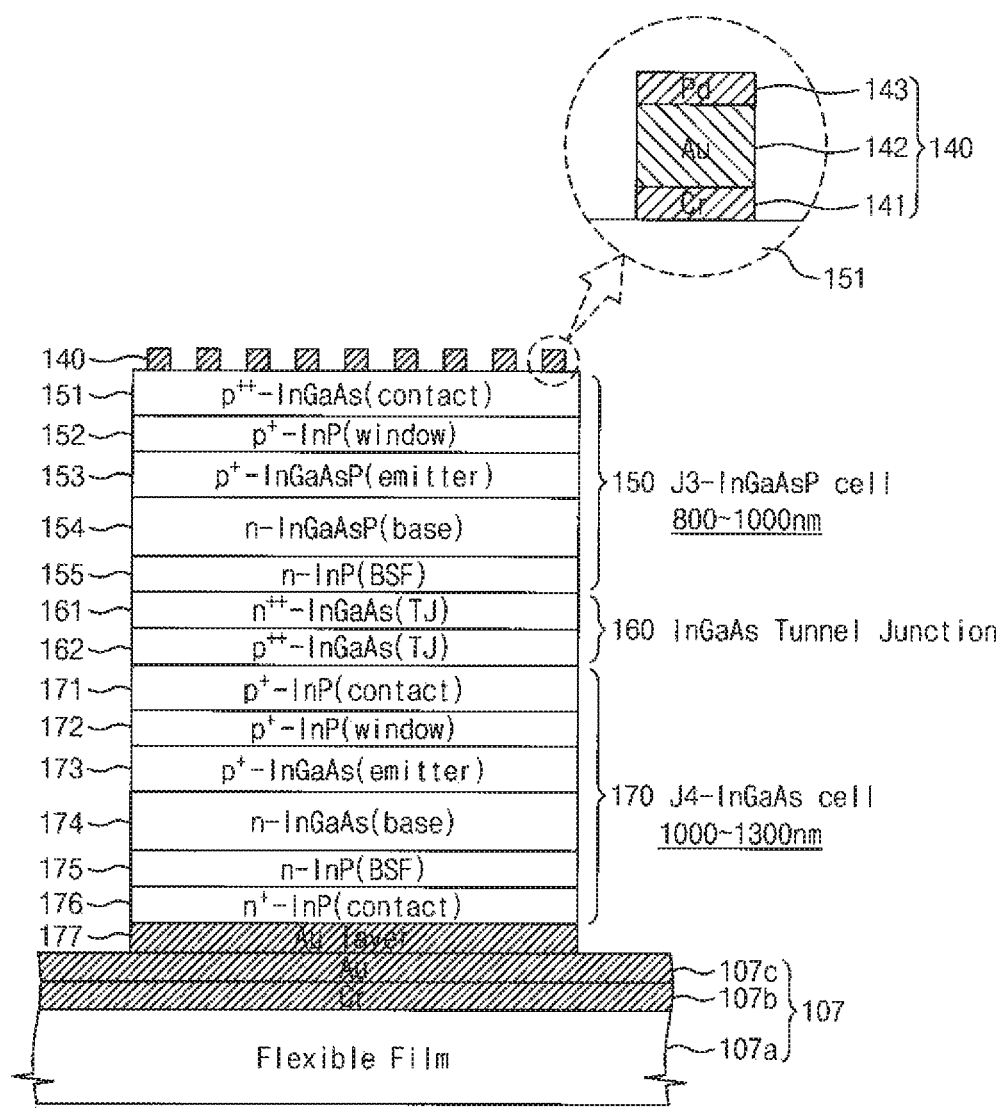

Referring to FIG. 4E, a metal disk array 140 is formed on the $p^{++}$-InGaAs contact layer 151 of the third sub-cell 150 on the flexible film substrate 107a. The metal disk array 140 may be formed on an InGaAsP epitaxial surface of the third sub-cell 150 using a lift-off process. For example, a nanoimprint lithography process commonly used to form a nanostructure pattern with a large area may be used. After an MDA resist pattern is formed using a nanoimprint process, a metal thin film is deposited by an e-beam evaporator.

The metal disk array 140 includes metal disk array seed layers 141 arranged in a matrix form, an intermediate metal disk array layer 142 disposed on the bottom metal disk array seed layers 141; and a metal disk array ohmic contact layer 143 on which the intermediate metal disk array layer is disposed. The metal disk array seed layer 141 may include chromium (Cr) or titanium (Ti)/platinum (Pt) of 20 nm or less. The intermediate metal disk array layer 142 include gold (Au) or silver (Ag). The contact layer 143 may include palladium (Pd).

Next, a patterned metal disk array 140 may be formed using a wet etching process to remove the MDA resist pattern.

Figure 4F:
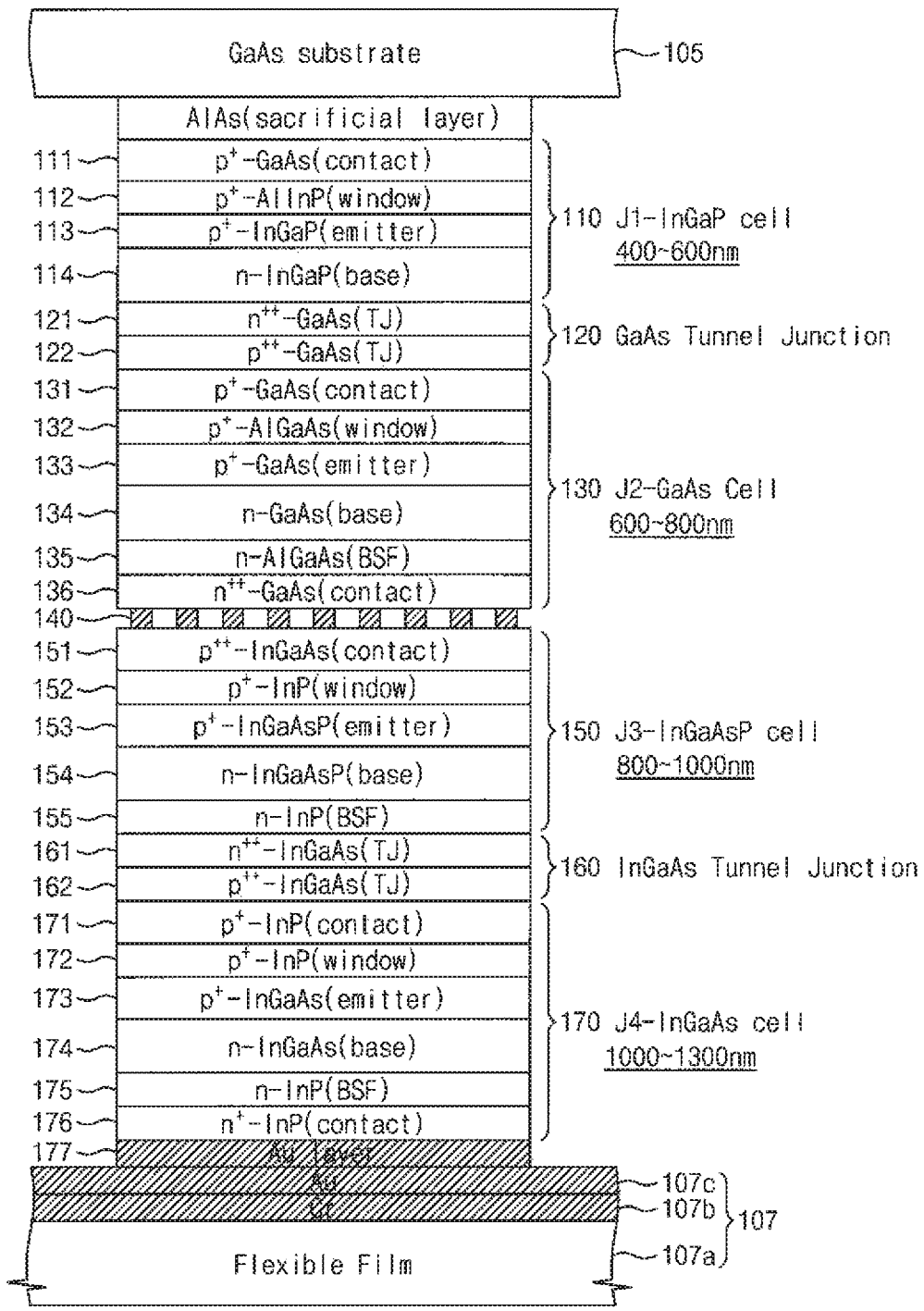
Figure 4G:
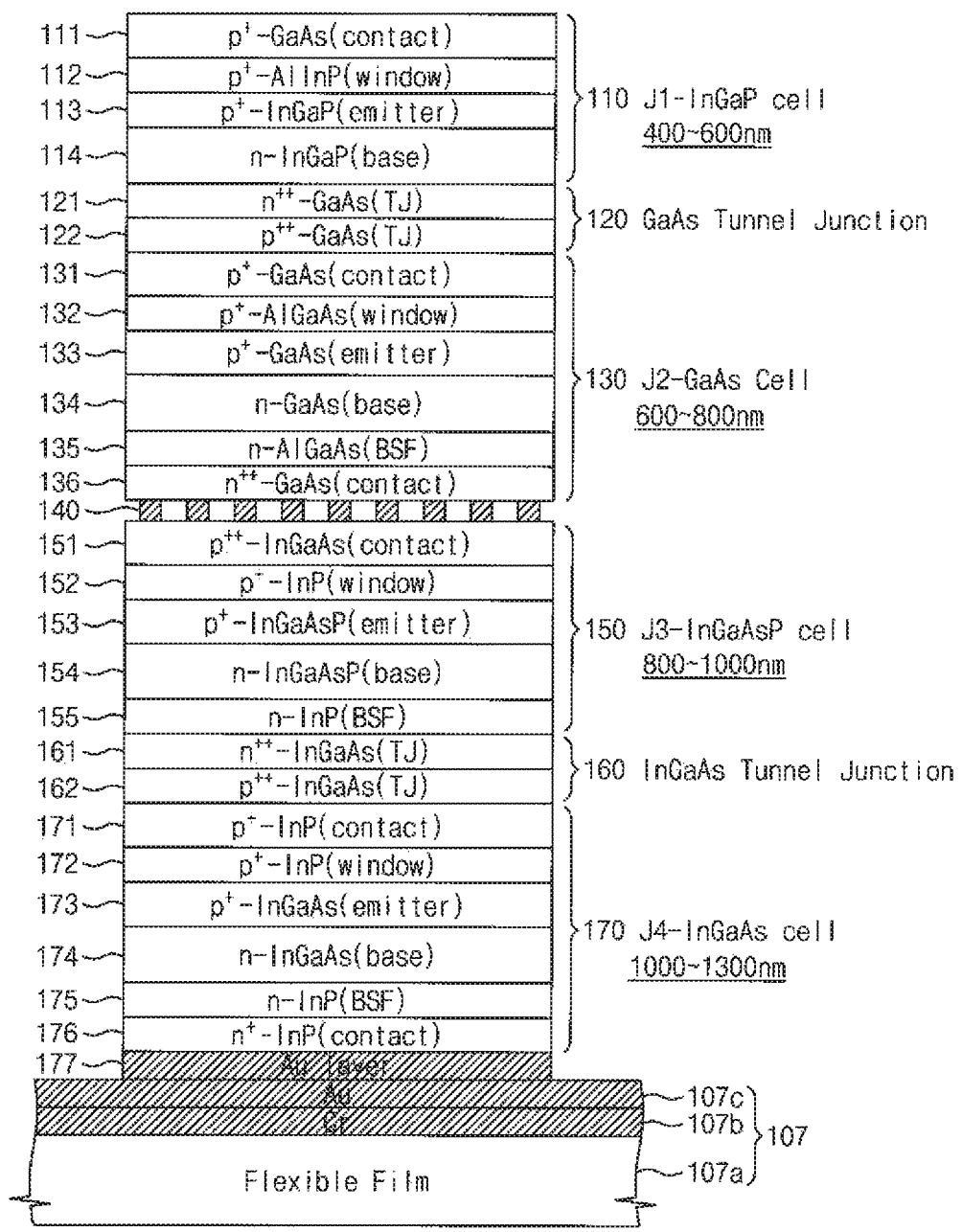

Referring to FIG. 4F, the metal disk array 140 formed on the flexible film substrate 107a and the $n^{++}$-GaAs contact layer 136 of the second sub-cell 130 are placed on the GaAs substrate 105 to face each other and are pressed to be bonded to each other. An MDA/J3/J4 structure and a J2/J1/AlAs/GaAs substrate structure on the flexible film substrate 107a are bonded to each other using a wafer bonding apparatus. The bonding is boding of an MDA and an epitaxial layer of the second sub-cell 130. To this end, a surface of the $n^{++}$-GaAs contact layer 136 of the second sub-cell 130 is activated using an argon (Ar) ion plasma treatment. Next, bonding is performed by applying a pressure of 5 to 10 MPa to the J2/J1/AlAs/GaAs substrate structure in the wafer bonding apparatus.

When the wafer bonding process is completed, a J4/J3/MDA/J2/J1/first AlAs sacrificial layer/GaAs structure is formed on the flexible film substrate 107a.

Referring to FIG. 4O, the GaAs substrate 105 is removed by removing the first AlAs sacrificial layer 119 disposed between the GaAs substrate 105 and the first sub-cell 110.

When an epitaxial lift-off (ELO) process using an HF solution is performed on the J4/J3/MDA/J2/J1/first AlAs sacrificial layer/GaAs substrate structure on the flexible film substrate 107a, the sacrifice layer 119 and the GaAs substrate 105 are removed from the solar cell. A quadruple junction solar cell is fabricated on the flexible film substrate 107a.

Figure 4H:
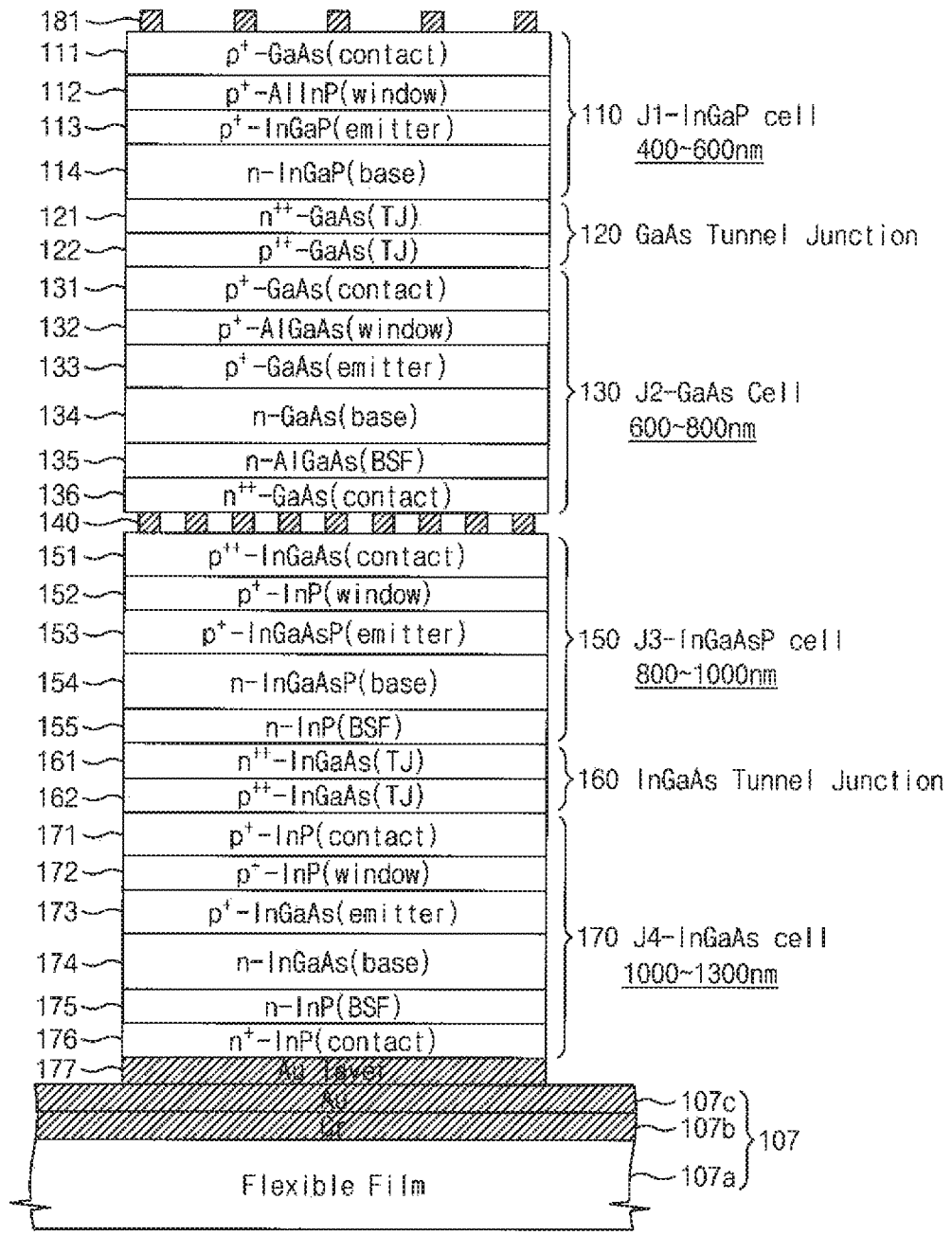

Referring to FIG. 4H, a metal finger electrode pattern 181 is formed on the exposed first sub-cell 110. The metal finger electrode pattern 181 may be formed using a lift-off process. A material of the metal finger electrode pattern 181 may be a metal providing ohmic contact with the $p^+$-GaAs contact layer 111. More specifically, the metal finger electrode pattern 181 may be formed of gold or silver.

As described above, according to an example embodiment of the present disclosure, a tandem solar cell combined by a wafer bonding technique may electrically connects sub-cells using a metal disk array and operate as an optical filter to reflect a specific wavelength band to improve photoelectric conversion efficiency.

Moreover, the metal disk array may include layers providing ohmic contact to provide ohmic contact with a semiconductor.

Although the present disclosure and its advantages have been described in detail, it should be understood that various changes, substitutions and alterations can be made herein without departing from the spirit and scope of the disclosure as defined by the following claims.

What is claimed is:

1. A method of fabricating a tandem solar cell, comprising:
    sequentially laminating a first AlAs sacrificial layer, a first sub-cell, a GaAs tunnel junction layer, and a second sub-cell on a GaAs substrate;
    sequentially laminating a second AlAs sacrificial layer, a third sub-cell, an InGaAs tunnel junction layer, and a fourth sub-cell on an InP substrate;
    forming an auxiliary metal electrode layer on the fourth sub-cell laminated on the InP substrate;
    patterning the InP substrate on which the auxiliary metal electrode layer is formed;
    sequentially laminating a metal seed layer and a metal electrode layer on a flexible film substrate;
    bonding the metal electrode layer laminated on the flexible film substrate to the auxiliary metal electrode layer formed on the patterned InP substrate to form a bonded InP substrate and flexible film substrate;
    removing the second AlAs sacrificial layer disposed between the InP substrate and the third sub-cell to remove the InP substrate from the bonded InP substrate and flexible film substrate;
    forming a metal disk array on the third sub-cell bonded to the flexible film substrate;
    locating the metal disk array and the second sub-cell to face each other and compressing the metal disk array and the second sub-cell to be bonded to each other;
    removing the first AlAs sacrificial layer disposed between the GaAs substrate and the first sub-cell to remove the GaAs substrate; and
    forming a metal finger electrode pattern on the exposed first sub-cell,
    wherein the metal disk array on the third sub-cell in the flexible film substrate comprises: metal disk array seed layers arranged in a matrix format on the third sub-cell in the flexible film substrate; an intermediate metal disk array layer disposed on the lower metal disk array seed layer; and a metal disk array ohmic contact layer disposed on and aligned with the intermediate metal disk array layer.

2. The method as set forth in claim 1, wherein the metal disk array seed layer includes chromium (Cr) or titanium (Ti)/platinum (Pt) of 20 nanometers (nm) or less, the intermediate metal disk array layer includes gold (Au) or silver (Ag), and the metal disk array ohmic contact layer includes palladium (Pd).

3. The method as set forth in claim 1, wherein
the first sub-cell is an InGaP sub-cell and a wavelength band of the first sub-cell is between 400 and 600 nm,
the second sub-cell is a GaAs sub-cell and a wavelength band of the second sub-cell is between 600 and 800 nm,
the third sub-cell is an InGaAsP sub-cell and a wavelength band of the third sub-cell is between 800 and 1,000 nm, and
the fourth sub-cell is an InGaAs sub-cell and a wavelength band of the fourth sub-cell is between 1000 and 1300 nm.

4. The method as set forth in claim 1, wherein
the metal disk array has a pitch of 100 to 300 nm.

5. The method as set forth in claim 3, wherein the first sub-cell comprises: a $p^+$-GaAs contact layer disposed on the first AlAs sacrificial layer, a $p^+$-AlInP window layer disposed on the $p^+$-GaAs contact layer; a $p^+$-InGaP emitter layer disposed on the $p^+$-AlInP window layer; and an n-InGaP base layer disposed on the $p^+$-InGaP emitter layer.

6. The method as set forth in claim 3, wherein
the second sub-cell comprises:
a $p^+$-GaAs contact layer disposed on the GaAs tunnel junction layer;
a $p^+$-AlGaAs window layer disposed on the $p^+$-GaAs contact layer;
a $p^+$-GaAs emitter layer disposed on the $p^+$-AlGaAs window layer;
an n-GaAs base layer disposed on the $p^+$-GaAs emitter layer,
an n-AlGaAs back-surface field layer disposed on the n-GaAs base layer; and
an $n^{++}$-GaAs contact layer disposed on the n-AlGaAs back surface field layer.

7. The method as set forth in claim 3, wherein
the third sub-cell comprises:
a $p^{++}$-InGaAs contact layer disposed on the second AlAs sacrificial layer;
a $p^+$-InP window layer disposed on the $p^{++}$-InGaAs contact layer;
a $p^+$-InGaAsP emitter layer disposed on the $p^+$-InP window layer,
an n-InGaAsP base layer disposed on the $p^+$-InGaAsP emitter layer; and
an n-InP back surface field layer disposed on the n-InGaAsP base layer.

8. The method as set forth in claim 3, wherein
the fourth sub-cell comprises:
a $p^+$-InP contact layer disposed on the InGaAs tunnel junction layer,
a $p^+$-InP window layer disposed on the $p^+$-InP contact layer,
a $p^+$-InGaAs emitter layer disposed on the $p^+$-InP window layer;
an n-InGaAs base layer disposed on the $p^+$-InGaAs emitter layer,
an n-InP back surface field layer disposed on the n-InGaAs base layer; and
an $n^+$-InP contact layer disposed on the n-InP back surface field layer.

* * * * *